US006714055B2

(12) United States Patent
Hausmann

(10) Patent No.: US 6,714,055 B2
(45) Date of Patent: Mar. 30, 2004

(54) OUTPUT DRIVER DEVICES

(75) Inventor: Michael Hausmann, Unterhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/198,191

(22) Filed: Jul. 17, 2002

(65) Prior Publication Data

US 2003/0034807 A1 Feb. 20, 2003

(30) Foreign Application Priority Data

Jul. 23, 2001 (DE) ........................... 101 35 786

(51) Int. Cl.⁷ ................................ H03K 3/00
(52) U.S. Cl. ........................ 327/112; 327/108
(58) Field of Search ................ 327/108, 112; 326/83, 86, 87

(56) References Cited

U.S. PATENT DOCUMENTS

| | | | |
|---|---|---|---|
| 5,296,756 A | | 3/1994 | Patel et al. ............... 307/443 |
| 5,430,387 A | | 7/1995 | Bechade et al. .......... 326/27 |
| 5,777,496 A | * | 7/1998 | Herman .................... 327/108 |
| 5,854,560 A | | 12/1998 | Chow ........................ 326/27 |
| 6,100,729 A | * | 8/2000 | Nagano et al. ............ 327/112 |
| 6,307,409 B1 | * | 10/2001 | Wrathall .................... 327/112 |
| 6,320,432 B1 | * | 11/2001 | Nagao ........................ 327/108 |

FOREIGN PATENT DOCUMENTS

| | | | |
|---|---|---|---|
| EP | 0 072 686 A2 | 2/1983 | ......... H03K/19/094 |
| EP | 0 303 341 A2 | 2/1989 | ......... H03K/19/003 |
| EP | 0 606 912 A2 | 7/1994 | ............ H03K/5/15 |

* cited by examiner

*Primary Examiner*—Toan Tran
(74) *Attorney, Agent, or Firm*—Fish & Richardson P.C.

(57) ABSTRACT

The invention features an output driver device for an integrated circuit that includes an output device having an output terminal for an output signal to be output from the output driver device, an input terminal for an input signal to be input into the output driver device, and a control device that is signal-connected to the output device and the input terminal and is designed to transform the input signal into two mutually different control signals and to output the control signals via control signal outputs to the output device, where the output device configured to generate the output signal in a manner dependent on the control signals.

9 Claims, 2 Drawing Sheets

OUTPUT DRIVER DEVICES

Figure 1:
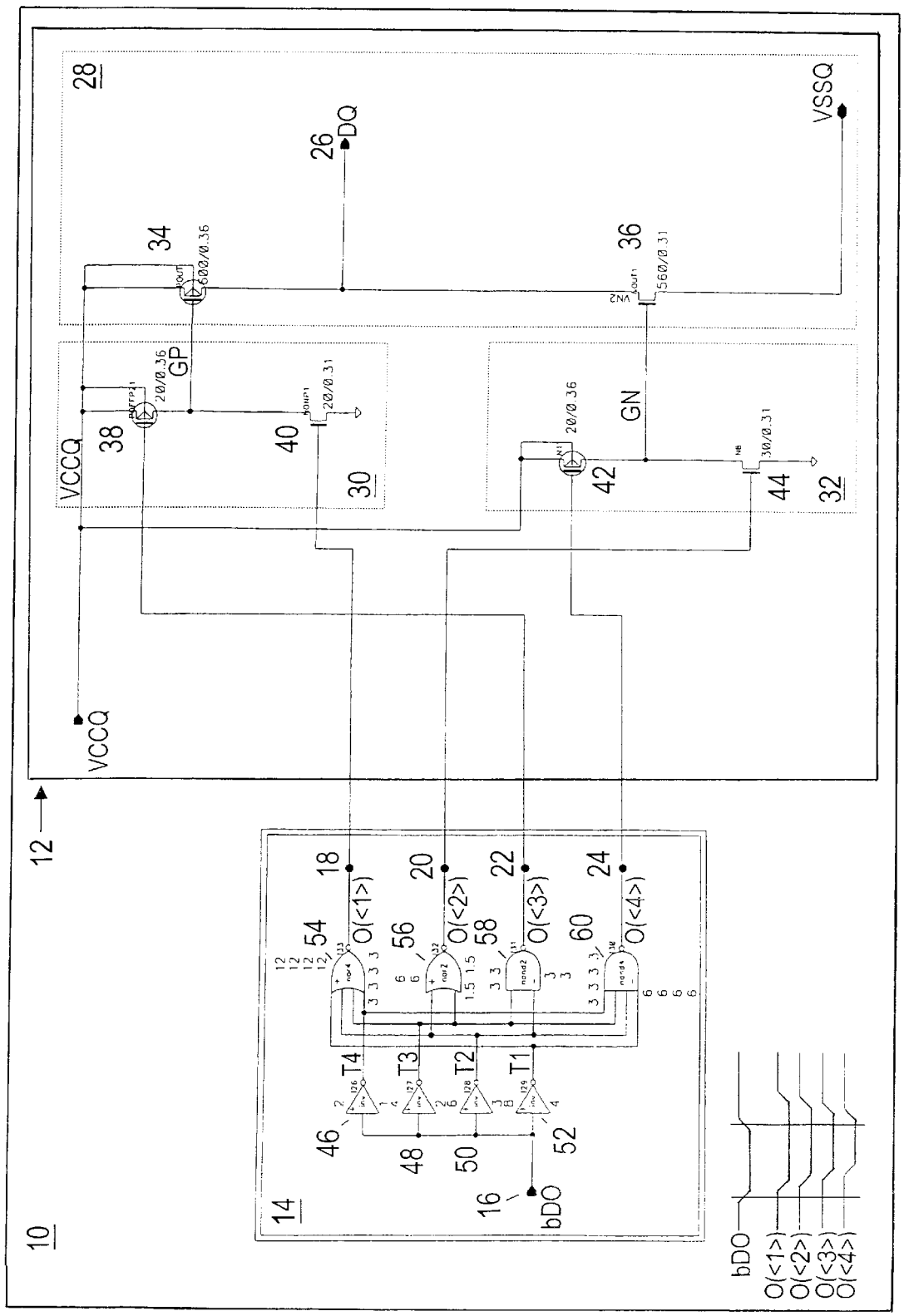

Pursuant to 35 U.S.C. 119(a)–(d), this application claims priority from German application no. 101 35 786.9, filed Jul. 23, 2001.

DESCRIPTION

The invention relates to an output driver device for an integrated circuit in accordance with claim 1 and to a method for outputting an output signal from an output driver device in accordance with claim 8.

Output driver devices (off chip driver, OCD) are used for signal outputting in particular in semiconductor components. The output driver device in this case represents the interface between the integrated circuit and its periphery and must satisfy a multiplicity of specifications with regard to the signal outputting (such as, for example, a suitable edge steepness (slew rate), short-circuit driver strength, access time ($t_{AC}$), hold time ($t_{OH}$) etc.).

Conventional output driver devices suffer from the disadvantage that the number of specifications to be complied with in respect of the signal outputting are often more numerous than the "degrees of freedom" of the output driver device. In order, for example, to set the edge steepness of a signal to be output in a specification-conforming manner, it is usually necessary to make interventions in the output driver device which lead to a multiplicity of undesirable changes to other specifications. This is because, conventionally, complying with required specifications of the output driver device is achieved by suitably altering individual transistor parameters of the output driver device. However, each change in an individual transistor parameter influences the entire switching behavior of the output driver device, as a result of which an iterative approximation with a multiplicity of steps is required in order to satisfy all the specifications.

In view of these disadvantages, it is an object of the invention to specify an output driver device which, in a simple manner, can be coordinated with a multiplicity of specifications to be complied with. Furthermore, it is an object of the invention to specify a corresponding method for outputting an output signal from an output driver device.

This object is achieved according to the invention by means of an output driver device in accordance with claim 1 and a method in accordance with claim 8. The dependent claims relate to preferred embodiments.

According to the invention, an output driver device for an integrated circuit comprises at least one output device, which has at least one output terminal for an output signal to be output from the output driver device;

at least one input terminal for an input signal to be input into the output driver device; and at least one control device, which is signal-connected to the output device and the input terminal and is designed for the transformation of the input signal into at least two mutually different control signals and for the outputting of the control signals via control signal outputs to the output device, the output device being designed for the generation of the output signal in a manner dependent on the control signals. According to the invention, an additional control device is provided between the output device, which outputs the output signal to an, in particular, external output terminal, and the input terminal of the output driver device. This control device is designed to transform or convert the input signal present at the input terminal—which may also be a node in an integrated circuit—into two mutually different control signals. The output device subsequently generates the output signal in a manner dependent on these at least two control signals.

Since the input signal is thus transformed into two different control signals by the control device and the output signal is generated in a manner dependent on these control signals, the control device provides at least one additional "degree of freedom" for the coordination of the output driver device for satisfying the required specifications in respect of the signal outputting. This is because the control device can preferably be designed such that the control signals differ from the input signal in such a way that a required specification, for example the edge steepness of the output signal, is satisfied. The output driver device preferably comprises a control device which is designed for a transformation of the input signal into a multiplicity (e.g. 4) of mutually different control signals. In this case, three additional degrees of freedom are obtained for the co-ordination of the output driver device.

In accordance with one preferred embodiment of the invention, the control signals and the input signal are binary pulse signals and the control device is designed for a transformation of the input signal such that at least one of the control signals differs from the input signal by at least one relative temporal shift of at least one of the signal edges of the control signal with respect to the corresponding signal edge of the input signal. Consequently, the control device is designed for a time sequence variation of the input signal. In this connection, binary pulse signals are understood to be voltage signals which comprise, in particular, essentially rectangle-like pulses with a lower voltage value (low) and an upper voltage value (high). The control device preferably transforms the input signal in such a way that the input signal differ [sic] from at least one of the control signals by virtue of the temporal position of the rising/falling signal edges of corresponding pulses between input signal and control signal. This makes it possible, for example by means of a predetermined time delay of the signal edges of one of the control signals relative to the input signal, to output such control signals to the output device which serve for more advantageous switching of the output device for the purpose of satisfying the specifications.

In accordance with a further preferred embodiment, the control device is designed for a transformation of the input signal such that rising signal edges of the control signal (i.e. low-high transitions) are time-delayed by a first delay time and falling signal edges of the control signal (i.e. high-low transitions) are time-delayed by a second delay time relative to the corresponding signal edges of the input signal. The first delay time may deviate from the second delay time in this case. Such time control of the control signals according to the invention enables greater flexibility when switching individual transistors of the output device, as a result of which specifications that are to be satisfied by the output driver device can be established more easily.

In accordance with a further preferred embodiment, the control device comprises at least one NOR and at least one NAND gate, whose gate outputs are in each case electrically connected precisely to one of the control signal outputs. The control device comprises at least two inverters whose inverter outputs are in each case electrically connected to a gate input both of the NOR and of the NAND gate and whose inverter inputs are in each case electrically connected to the input terminal. The gates and/or inverters of the control device are chosen in such a way that the control signals generated by the control device differ from one another in particular in terms of their time sequence. By way of example, the first control signal differs from the input signal by virtue of a long time delay of rising signal edges of the control signal relative to the corresponding signal edge of the input signal and an only short time delay in the case of falling signal edges. By contrast, the second control signal could differ from the input signal by virtue of a short time delay in the case of rising signal edges and a long time delay in the case of falling signal edges. The better control thereby obtained over switching instants of the output device (an additional "degree of freedom") simplifies the satisfying of the required specifications. In order to obtain such time sequence control by the control device, the gates and/or the inverters may differ from one another in terms of their physical characteristic quantities (for example through different ratios of channel length to channel width of the transistors used).

Preferably, the control device comprises four of the inverters and in each case two of the NOR and NAND gates. Preferably, in this case two of the inverter outputs are electrically connected to in each case a gate input of one of the NOR and one of the NAND gates and two of the inverter outputs are electrically connected to in each case two gate inputs of one of the NOR and one of the NAND gates. Such a control device is designed for the transformation of the input signal into four mutually different control signals, so that three additional "degrees of freedom" are obtained. Through a suitable choice of (different) inverters and/or gates, it is possible in this case to establish the temporal position of the rising and falling signal edges of the control signals for the purpose of better control of the switching behavior of the output device. A circuit with four parallel-connected inverters whose outputs are connected to corresponding inputs of the NOR and NAND gates is preferably taken into consideration in this case.

Such an arrangement of the control device advantageously enables a significant reduction of an undesirable shunt current (a current flow from VCCQ to VSSQ through the driver transistors) through driver transistors of an output-side inverter circuit of the output device, since the control signals can be chosen in such a way that both the p-type and the n-type transistor of the inverter circuit are never simultaneously in an on state.

In accordance with a further preferred embodiment, the output device comprises at least one output-side inverter circuit and at least two input-side inverter circuits with in each case a p-type and an n-type transistor (p-channel and n-channel transistors), an inverter output of the output-side inverter circuit being electrically connected to the output terminal, the gate of the p-type transistor of the output-side inverter circuit being electrically connected to an inverter output of the first input-side inverter circuit, the gate of the n-type transistor of the output-side inverter circuit being electrically connected to an inverter output of the second input-side inverter circuit, and the gates of the p-type and n-type transistors of the input-side inverter circuits being electrically connected to the control signal outputs of the control device.

The output device thus comprises essentially two cascaded inverter stages, the output of the output-side inverter circuit representing the output terminal of the output driver device. The gates of the p-type transistor and the n-type transistor of the output-side inverter circuit are electrically connected to the inverter outputs of two inverter circuits arranged on the input side, so that the two inputs of the output-side inverter circuit can be addressed separately. The inputs of the input-side inverter circuit, i.e. the gates of the two p-type and n-type transistor pairs, are connected to the control signal outputs of the control device. If a control device with two control signal outputs is chosen, then it is possible, for example, for the gates of the p-type and n-type transistors of the first input-side inverter circuit to be electrically connected to the first control signal output and the gates of the n-type and the p-type transistors of the second input-side inverter circuit to be electrically connected to the second control signal output.

What is particularly advantageous in this connection is a configuration with four control signal outputs, each gate of the four transistors of the input-side inverter circuits being connected precisely to one control signal output. As a result of this, the switching behavior of each transistor of the input-side inverter circuits can be controlled independently of the other transistors, as a result of which the output driver device can be co-ordinated particularly simply and effectively. What is particularly advantageous, accordingly, is an output driver device in which the control device is designed for the transformation of the input signal into four mutually different control signals and in which the control device comprises four control signal outputs which are in each case electrically connected precisely to one of the gates of the transistors of the input-side inverter circuits.

According to the invention, a method for outputting an output signal from an output driver device, preferably according to the invention, comprises the following steps:

inputting of an input signal into a control device of the output driver device;

transformation of the input signal into at least two mutually different control signals by means of the control device;

outputting of the control signals from the control device to an output device of the output driver device;

generation of an output signal by means of the output device in a manner dependent on the control signals; and outputting of the output signal to an output terminal of the output device.

By virtue of the transformation of the input signal into at least two mutually different control signals, the method according to the invention accordingly provides at least one additional "degree of freedom" for the co-ordination of the output driver device, so that specifications to be satisfied in respect of the signal outputting can be set more simply.

In accordance with one preferred embodiment of the method according to the invention, the control signals and the input signal are binary pulse signals and the input signal is transformed in such a way that at least one of the control signals differs from the input signal by at least one relative temporal shift of the signal edges of the control signal with respect to the corresponding signal edges of the input signal. In this connection, a binary pulse signal is understood to be a voltage signal which has, in particular, essentially rectangular pulses between a low and a high voltage value.

Preferably, the input signal is transformed in such a way that rising signal edges of the control signal are time-delayed by a first delay time and falling signal edges of the control signal are time-delayed by a second delay time relative to the corresponding signal edges of the input signal.

Figure 2A:
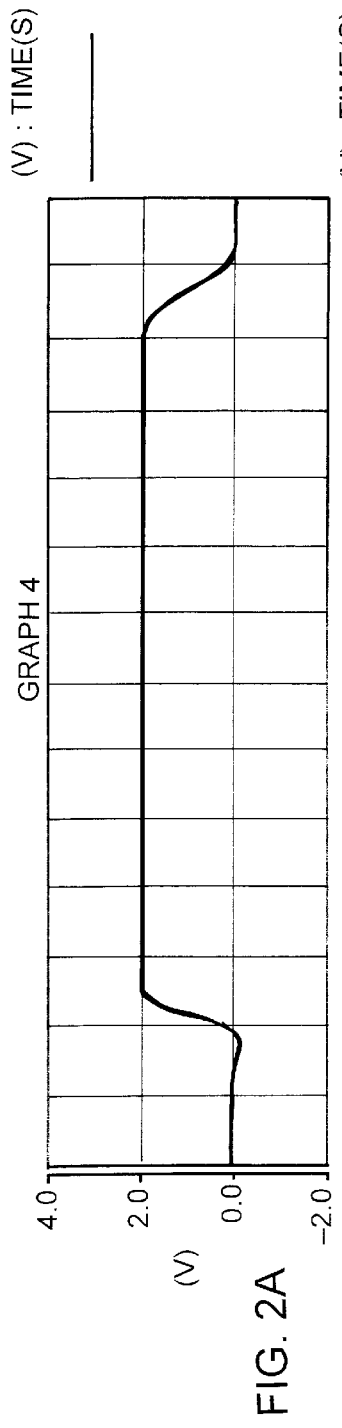
Figure 2B:
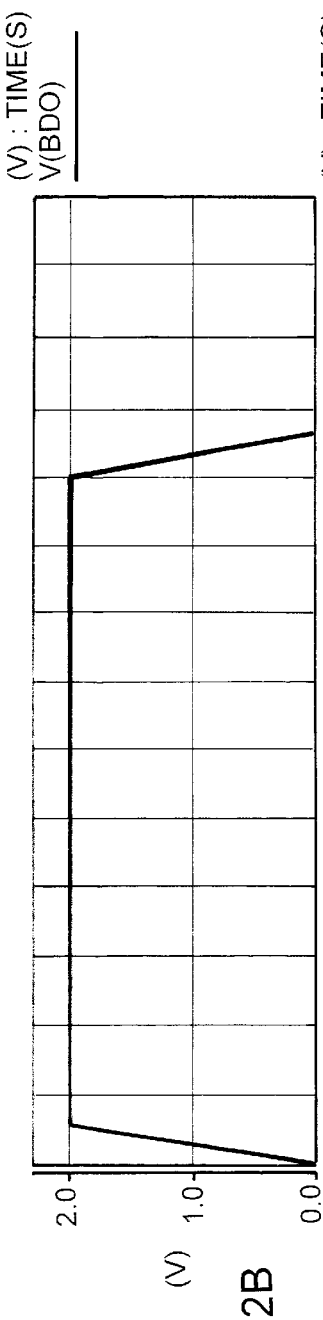
Figure 2C:
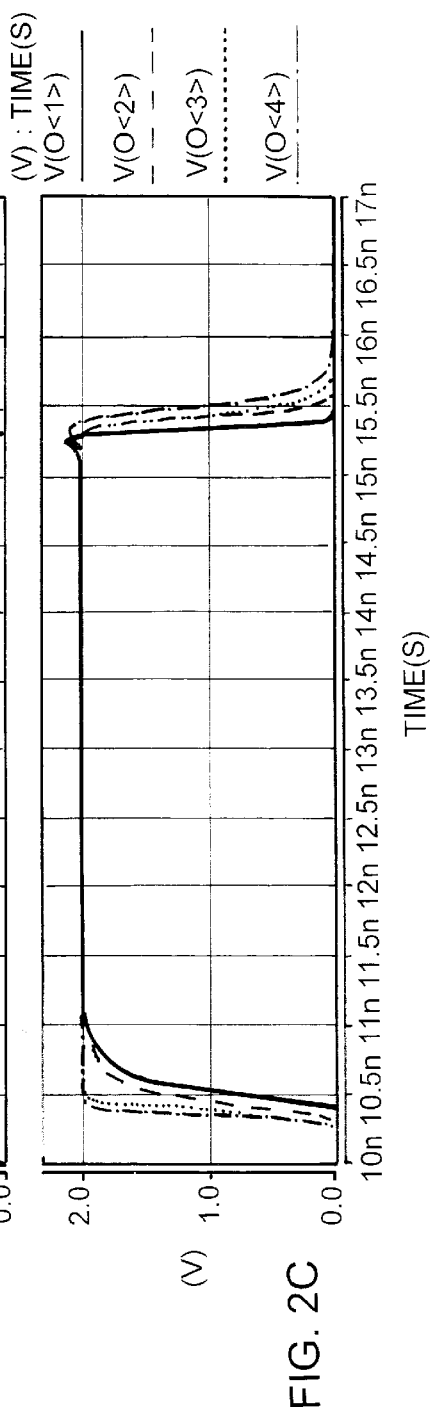

The invention is described below by way of example with reference to the accompanying drawings. In the figures:

FIG. 1 shows a simplified circuit of a particularly preferred embodiment of an output driver device according to the invention with sketched time behavior of the controlled signals, and FIGS. 2(a)–2(c) show a simulated pulse diagram which shows the time profile of the control signals and of the output signal relative to the input signal of the output driver device in accordance with FIG. 1.

FIG. 1 illustrates a particularly preferred embodiment of an output driver device according to the invention. The output driver device 10 comprises an output device 12 and also a control device 14. The control device 14 has an input terminal 16 for an input signal bDO to be input into the output driver device 10. In accordance with this particularly preferred embodiment, in the control device 14, the input signal bDO is transformed into four mutually different control signals O<1> to O<4>, which are output to respective control signal outputs 18, 20, 22 and 24. The output device 12 generates the output signal DQ, which is output via an output terminal 26, in a manner dependent on the incoming control signals O<1> . . . O<4>.

The output device 12 of the preferred embodiment of the output driver device 10 is described below. The output device 12 comprises an output-side inverter circuit 28, a first input-side inverter circuit 30 and also a second input-side inverter circuit 32. Each of the inverter circuits 28 to 32 comprises, in a conventional manner, a p-channel and an n-channel transistor which are connected in series between the voltage supply VCCQ and ground or the voltage supply VSSQ. The gate of the p-type transistor 34 of the output-side inverter circuit 28 is connected to the output of the first input-side inverter circuit 30. In a similar manner, the gate of the n-type transistor 36 of the output-side inverter circuit 28 is connected to the output of the second input-side inverter circuit 32. The gates of the input-side inverter circuits 30,32 are in each case electrically connected to precisely one control signal output 28 [sic], 20, 22 and 24 of the control device 14, so that each of the driver transistors 38 to 44 of the input-side inverter circuits 30, 32 can be driven separately by the control device 14.

It is thus possible for the driver transistors 38 to 44 of the inverter circuits 30, 32 to be switched in particular at different instants, as a result of which a specified edge steepness (slew rate), short-circuit driver strength, access time ($t_{AC}$), hold time ($t_{OH}$) etc. can advantageously be established without a complex iterative adaptation being necessary for this purpose—on account of a reciprocal dependence of the transistors 38 to 44 on one another. The output device 12, which thus essentially comprises two cascaded inverter stages, can be adapted significantly more simply to different specifications of the output signal DQ as a result of the control device 14 arranged between the input terminal 16 and the gates of the input-side inverter circuit transistors 38 to 44.

A particularly preferred embodiment of the control device 14 according to the invention as illustrated in FIG. 1 is described in more detail below. The input terminal 16 is electrically connected to respective inverter inputs of four inverters 46, 48, 50 and 52. The inverter outputs of the inverters 46 to 52 are connected to gate inputs of four gates. A NOR gate 54 with four gate inputs, a NOR gate 56 with two gate inputs, a NAND gate 58 with two gate inputs and a NAND gate 60 with four gate inputs are provided here. The in each case four gate inputs of the gates 54 and 60 are in each case connected to precisely one inverter output of the inverters 46 to 52. The in each case two gate inputs of the gates 56 and 58 are in each case connected to the gate outputs of the gates 48 and 50.

According to customary convention, the numerical values specified above and below the inverters and gates 46 to 60 denote the relative channel widths of the respective CMOS transistors from which the inverters and gates are constructed. By way of example, the numeral $N_1$, specified above the inverters 46 to 52, denotes the ratio $N_1/L_{min}$ of the p-type transistor of the respective inverter, where $L_{min}$ specifies the channel length of the transistor. In a similar manner, the numeral $N_2$, specified below the inverter symbols, denotes the relative channel width of the n-type transistors of the inverters. The relative channel width of the transistors of the gates 54 to 60 is equally specified, in the case of the NOR gates the series-connected p-type transistors in each case being specified above the gate symbol and the parallel-connected n-type transistors being specified below the gate symbol.

A (greatly simplified) pulse diagram of the control device 14 is illustrated below the control device 14 in FIG. 1. On account of the special selection of the inverters 46 to 52 and gates 54 to 60, the four control signals O<1> . . . O<4> in each case differ from one another and from the input signal bDO. Thus, the time delay which the control device 14 [lacuna] in the case of a falling signal edge (i.e. in the case of a transition from a high to a low voltage value of the binary input signal high-low transition) increases monotonically between the input signal bDO from the control signal O<1> to the control signal O<4>, so that the control signal O<4> experiences the longest temporal delay in the case of falling signal edges. Conversely, in the case of rising signal edges (low-high transitions), the temporal delay with respect to the respective signal edge of the input signal bDO increases from the control signal O<4> to the control signal O<1>.

The pulse response of the control device 14 is illustrated in more detail in the (calculated or simulated) pulse diagrams of FIG. 2. FIG. 2(b) illustrates the temporal profile of the input signal bDO and FIG. 2(c) illustrates the respective temporal profiles of the control signals O<1> . . . O<4>. The output signal DQ output by the output device 12 in the case of driving with such control signals O<1> . . . O<4> is illustrated in the simulation in FIG. 2(a). By virtue of the possibility of exact and separate setting of the respective switching instants of the driver transistors of the input-side inverter circuits 30 and 32, additional "degrees of freedom" are obtained for the adaptation of the output driver device 10 to output signal specifications that are to be satisfied.

A further important advantage of such driving of the output device resides in the fact that the individual driving of the four driver transistors 38 to 44 enables an effective minimization of a harmful shunt current through the output driver transistors 34 and 36. By way of example, if a high voltage signal DQ is output at the output terminal 26, i.e. the respective gates of the transistors 38 to 44 are from [sic] a high potential, then no shunt current can flow through the transistors 34 and 36 in the event of a high-low signal transition of the output signal DQ. This is because the p-type transistor 34, which is in an on state in the case of a high output signal DQ, is closed by the inverter circuit output of the first input-side inverter circuit 30 before the n-type transistor 36 is brought to its on state by the second input-side inverter circuit 32. Accordingly, the control device 14 transforms the input signal bDO in such a way that, independently of the direction of the edge of the input signal bDO, the transistors that are presently in the on state are always switched off before the transistors that are currently in the off state are switched on, thereby enabling a particularly simple possibility of adaptation of the shunt current and of the edge steepness.

The channel width to channel length ratios are specified—according to customary convention—beside the respective transistors 34 to 44 of the output device 12.

In addition to the particularly preferred embodiment of the output driver device according to the invention as illustrated in FIGS. 1 and 2, it is also possible to use a simplified embodiment (not illustrated) in which the control device is designed merely for a transformation of the input signal bDO into two control signals O<1> and O<2>. In this case, the first control signal O<1> can be applied to the gates of the transistors 38 and 40 of the input-side inverter circuit 30, while the control signal O<2> is applied in a similar manner to the gates of the transistors 42 and 44. Although such a circuit does not enable complete decoupling and individual driving of the transistors 38 to 40, an additional "degree of freedom" is obtained in this case, too, by virtue of the transformation of the input signal bDO into two mutually different control signals O<1> and O<2>, as a result of which an adaptation of the output driver device to specifications of the output signal DQ that are to be satisfied can be realized more simply.

What is claimed is:

1. An output driver device for an integrated circuit, the output driver device comprising:
   an output device having an output terminal for an output signal to be output from the output driver device;
   an input terminal for an input signal to be input into the output driver device; and
   a control device having
      a NOR gate,
      a NAND gate,
      gate outputs electrically connected to control signal outputs, and
      two inverters, the two inverters having
         inverter outputs electrically connected to a gate input of the NOR gate and of the NAND gate, and
         inverter inputs electrically connected to the input terminal,
   the control device being signal-connected to the output device and the input terminal and configured to transform the input signal into two mutually different control signals and to output the control signals via control signal outputs to the output device,
   wherein the output device is configured to generate the output signal in a manner dependent on the control signals.

2. The output driver device of claim 1, wherein the control signals and the input signal are binary pulse signals and the control device is configured to transform the input signal such that the control signals differ from the input signal by at least one relative temporal shift of the signal edges of the control signal with respect to the corresponding signal edge of the input signal.

3. The output driver device of claim 2, wherein the control device is configured to transform the input signal in such a way that rising signal edges of the control signal are time-delayed by a first delay time and falling signal edges of the control signal are time-delayed by a second delay time relative to the corresponding signal edges of the input signal.

4. The output driver device of claim 1, wherein the control device comprises four inverters, two NOR and NAND gates, and two inverter outputs electrically connected to a gate input of one of the NOR and one of the NAND gates and two of the inverter outputs are electrically connected to two gate inputs of the NOR and the NAND gates.

5. The output driver device of claim 1, wherein the output device comprises an output-side inverter circuit and two input-side inverter circuits having a p-type and an n-type transistor,
   an inverter output of the output-side inverter circuit is electrically connected to the output terminal,
   a gate of the p-type transistor of the output-side inverter circuit is electrically connected to an inverter output of the first input-side inverter circuit,
   a gate of the n-type transistor of the output-side inverter circuit is connected to an inverter output of the second input-side inverter circuit, and
   gates of the p-type and n-type transistors of the input-side inverter circuits are electrically connected to the control signal outputs of the control device.

6. The output driver device of claim 5, wherein the control device is configured to transform the input signal into four mutually different control signals and includes four control signal outputs electrically connected to one of the gates of the transistors of the input-side inverter circuits.

7. A method for outputting an output signal from an output driver device as recited in claim 1, the method comprising:
   inputting an input signal into the control device of the output driver device;
   transforming the input signal into two mutually different control signals by means of the control device;
   outputting the control signals from the control device to an output device of the output driver device;
   generating an output signal by means of the output device in a manner dependent on the control signals; and
   outputting the output signal to an output terminal of the output device.

8. The method according to claim 7, wherein the control signals and the input signal are binary pulse signals and the input signal is transformed in such a way that the control signals differ from the input signal by at least one relative temporal shift of the signal edges of the control signal with respect to the corresponding signal edges of the input signal.

9. The method of claim 8, wherein the input signal is transformed in such a way that rising signal edges of the control signal are time-delayed by a first delay time and falling signal edges of the control signal are time-delayed by a second delay time relative to the corresponding signal edges of the input signal.

* * * * *